(12) United States Patent
Takasu

(10) Patent No.: US 8,465,999 B2
(45) Date of Patent: Jun. 18, 2013

(54) MANUFACTURING METHOD FOR IMAGE SENSOR IC

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/409,744

(22) Filed: Mar. 1, 2012

(65) Prior Publication Data

US 2012/0161272 A1 Jun. 28, 2012

Related U.S. Application Data

(63) Continuation of application No. 12/004,157, filed on Dec. 19, 2007, now abandoned.

(30) Foreign Application Priority Data

Dec. 20, 2006 (JP) .................................. 2006-342746

(51) Int. Cl.
*H01L 21/00* (2006.01)

(52) U.S. Cl.
USPC .................................. 438/66; 438/64; 438/28

(58) Field of Classification Search
USPC .................................... 438/26, 28, 38, 64, 66
See application file for complete search history.

*Primary Examiner* — Thao Le
*Assistant Examiner* — Allen Parker
(74) *Attorney, Agent, or Firm* — Adams & Wilks

(57) ABSTRACT

In a manufacturing method for an image sensor integrated circuit, a plurality of pixel regions each having a photodiode are arranged on a silicon substrate. A light-transmissive conductive film is formed over the silicon substrate. A protective film is formed on the light-transmissive conductive film while holding a potential of the light-transmissive conductive film at the same potential as that of the silicon substrate.

20 Claims, 3 Drawing Sheets

Prior Art

MANUFACTURING METHOD FOR IMAGE SENSOR IC

CROSS-REFERENCE TO RELATED APPLICATION

This application is a continuation of U.S. application Ser. No. 12/004,157 filed Dec. 19, 2007 now abandoned, which is entirely incorporated herein by reference, and priority thereto for common subject matter is hereby claimed.

BACKGROUND OF THE INVENTION

1. Field of the Invention

The present invention relates to an image sensor IC (integrated circuit) used in a device for capturing and transmitting image information, such as a facsimile, an image scanner, and an electronic camera.

2. Description of the Related Art

FIG. 3 is an exemplary circuit diagram for showing an image sensor of a related art. In a sensor circuit 10 of a MOS image sensor, a reset transistor 11 serving as a switching element for resetting a photodiode 12 to an appropriate voltage, and an amplifier circuit 13 for amplifying light induced charges accumulated in the photodiode 12 are connected to the photodiode 12 including a PN junction.

Optical information can be obtained continuously through following three operations: a reset operation in which the reset transistor 11 is turned on so as to reset the photodiode 12 to a reset voltage to a satisfactory extent; an accumulation operation in which the reset transistor 11 is turned off so as to accumulate light induced charges in the photodiode 12 for a predetermined period of time; and a read operation in which the amplifier circuit 13 is turned on so as to amplify the light induced charges accumulated in the photodiode 12 to read.

Temporal storage of amplified signal may also be performed in the read operation by using a holding circuit 20 including a capacitive element 21 and two switching transistors (22A and 22B). The switching transistor 22A is turned on during the read operation, and the signal is stored in the storage capacitor 21 as an electrical charge by the amplifier circuit 13. The switching transistor 22A is then turned off and the switching transistor 22B is later turned on after an arbitrary holding time, thereby permitting the signal read from the storage capacitor 21.

Separate reading of the signal from the holding circuit in an arbitrary order is also possible after a series of operations, that is, the reset operation, the accumulation operation, and the read operation are collectively performed with respect to a plurality of photodiodes.

In these procedures, photoelectric conversion, whose characteristic is one of most the important characteristics in the photodiode, is performed according to an intensity of incident light to the photodiode 12.

In order to improve the photoelectric conversion characteristic, a photoelectric conversion element is disclosed which is capable of suppressing generation of a defect in a semiconductor region in which a depletion layer is formed in the photodiode 12 (for example, see JP 2004-312039 A (FIG. 24).

In the image sensor IC having a plurality of pixels arranged in one IC chip, however, a problem arises in that it leads to a variation of the photoelectric conversion characteristic due to change in intensity of incident light caused by a variation in thickness of a protective film formed on top of each of the plurality of photodiodes 12 which forms the pixels.

Though a countermeasure for the problem has been proposed in which planarization is performed after formation of the protective film, and in which a second protective film is formed to obtain further uniformity in the film thickness, problems still remain in that, for example, the number of process steps increases, which results in an increase in manufacturing costs, and sufficient uniformity cannot still be obtained.

SUMMARY OF THE INVENTION

In order to solve the above-mentioned problems, the present invention provides an image sensor with the following structure.

An image sensor IC, which has devices including a photodiode and a transistor formed on the same silicon substrate, includes a plurality of pixel regions each formed of the photodiode, in which the plurality of pixel regions each include a light-transmissive conductive material for potential fixation, which is fixed to the same potential, is formed on a lower surface of a protective film in the plurality of pixel regions. Alternatively, the image sensor IC has a structure in which, under the protective film in the plurality of pixel regions, a light-transmissive conductive material for potential fixation, which has a shape with an opening formed therein so as not to block incident light to the photodiode, is formed, and is electrically connected so as to be held at the same potential. Yet alternatively, the light-transmissive conductive material is electrically connected so as to be held at the same potential as a potential of the silicon substrate.

Further, each light-transmissive conductive material is formed of a polycrystalline silicon thin film or an ITO (compound of indium, tin, and oxygen) thin film. In order to improve optical transparency, a thickness of the polycrystalline silicon thin film is set to, for example, 2000 Å or smaller, preferably 1000 Å or smaller, and optimally 500 Å or smaller, in consideration of an optical absorption coefficient on a short wavelength side of visible light.

With those measures, each potential of regions which become a base at the time of forming the protective film can be set to be substantially constant over the entire pixel regions. Accordingly, a formation speed and film quality of the protective film formed on each of the pixels can be kept constant, whereby the protective film formed on each of the pixels has a substantially uniform film thickness and film quality. Consequently, the intensity of light incident on the photodiode of each of the pixels can be kept constant, thereby suppressing the variation in photoelectric conversion characteristic of the pixels, and obtaining an image sensor IC having the uniform photoelectric conversion characteristic over the entire IC.

DETAILED DESCRIPTION OF THE PREFERRED EMBODIMENTS

Preferred embodiments of the present invention will be described with reference to the accompanying drawings.

Figure 1A:
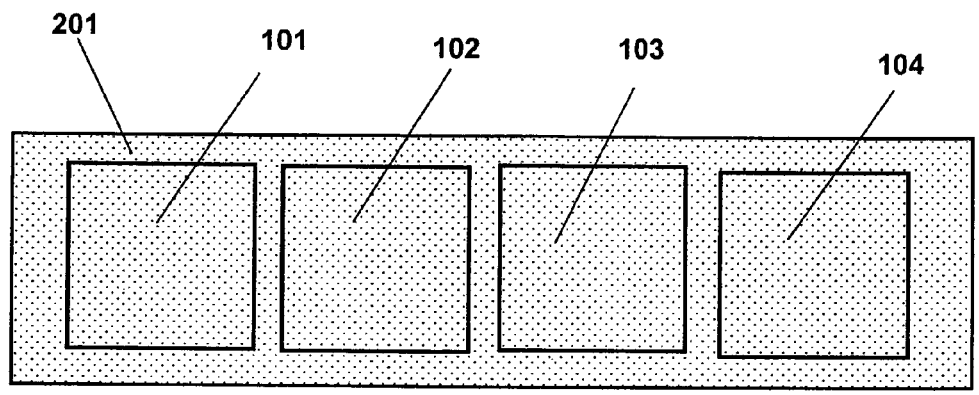
FIG. 1A is a schematic top view showing pixel regions of an image sensor according to a first embodiment of the present invention.
Figure 1B:
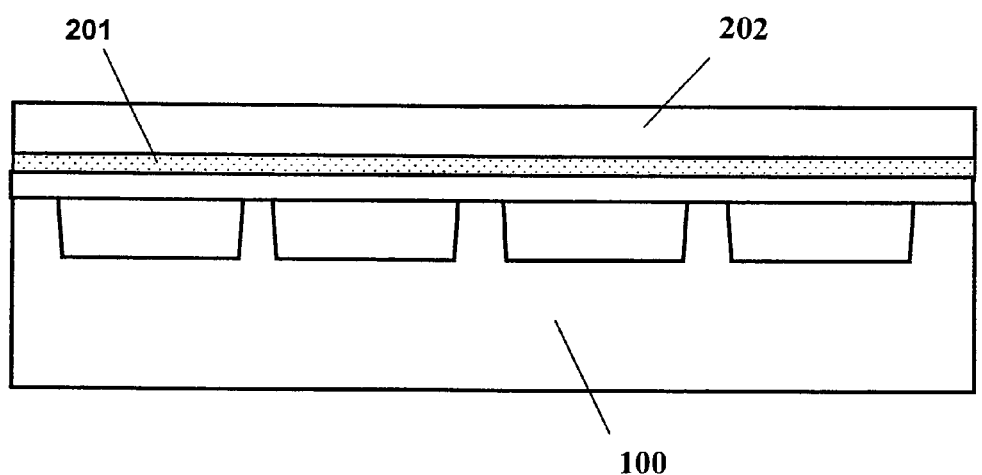
FIG. 1B is a plan view of the image sensor shown in FIG. 1A.

FIGS. 1A and 1B are a schematic top view and a plan view, respectively, showing pixel regions of an image sensor according to a first embodiment of the present invention.

A plurality of pixel regions 101, 102, 103 and 104, each having a photodiode, are disposed on a silicon substrate 100. The plurality of pixel regions 101, 102, 103, and 104 are covered with a light-transmissive conductive material 201 for potential fixation, which is formed of a polycrystalline silicon thin film. The light-transmissive conductive material 201 covering the pixel regions 101, 102, 103, and 104 has the same potential as a whole. The light-transmissive conductive material 201 is electrically connected so as to hold the same potential as the substrate potential of the silicon substrate on which the image sensor is formed though the connection is not shown in FIGS. 1A-1B. As a result, at the time of forming a protective film 202 on the pixel regions thereafter, each potential of underlying pixel regions can be kept substantially constant over the entire pixel regions in the image sensor IC. Thus, a formation speed and film quality of the protective film formed on each pixel can also be kept constant, and the protective film formed on each pixel has a substantially uniform film thickness and film quality. Accordingly, the intensity of the incident light to the photodiode of each pixel can be kept constant, thereby permitting suppression of the variation in photoelectric conversion characteristic of pixels and formation of an image sensor IC having a uniform photoelectric conversion characteristic over the image sensor IC.

In FIGS. 1A-1B, the light-transmissive conductive material is formed of a polycrystalline silicon thin film having a thickness of, for example, 2000 Å or smaller, preferably 1000 Å or smaller, and optimally 500 Å or smaller, thereby making it possible to further improve the transmittance of a light beam with a wavelength of a visible region.

Further, the light-transmissive conductive material 201 may be formed of an ITO (compound of indium, tin, and oxygen) thin film which is a material for a transparent conductive material widely used for a liquid crystal panel and the like.

Figure 2A:
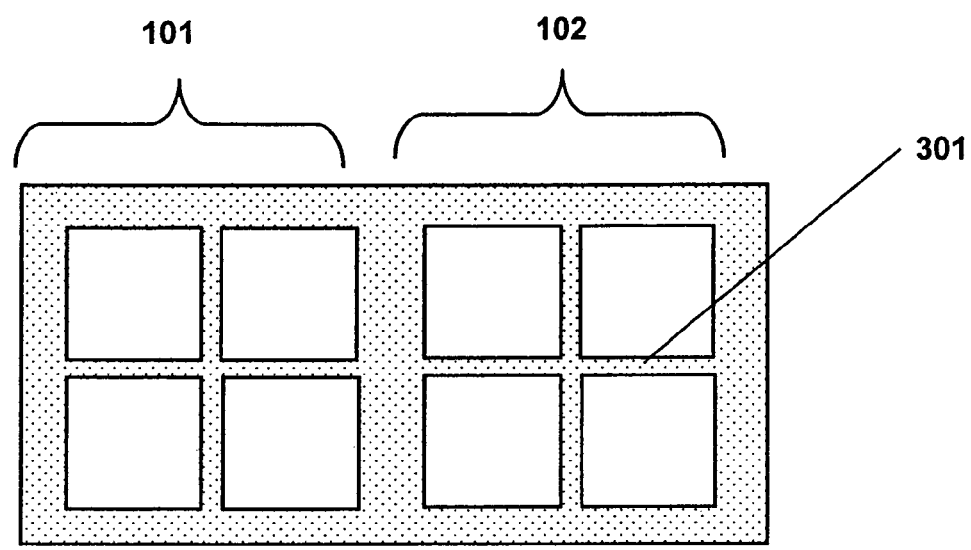
FIG. 2A is a schematic top view showing pixel regions of an image sensor according to a second embodiment of the present invention.
Figure 2B:
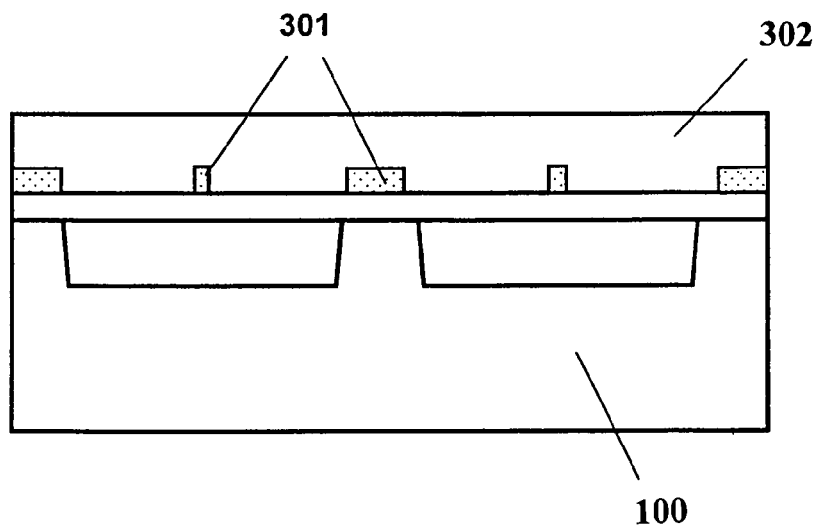
FIG. 2B is a plan view of an image sensor shown in FIG. 2A.
Figure 3:
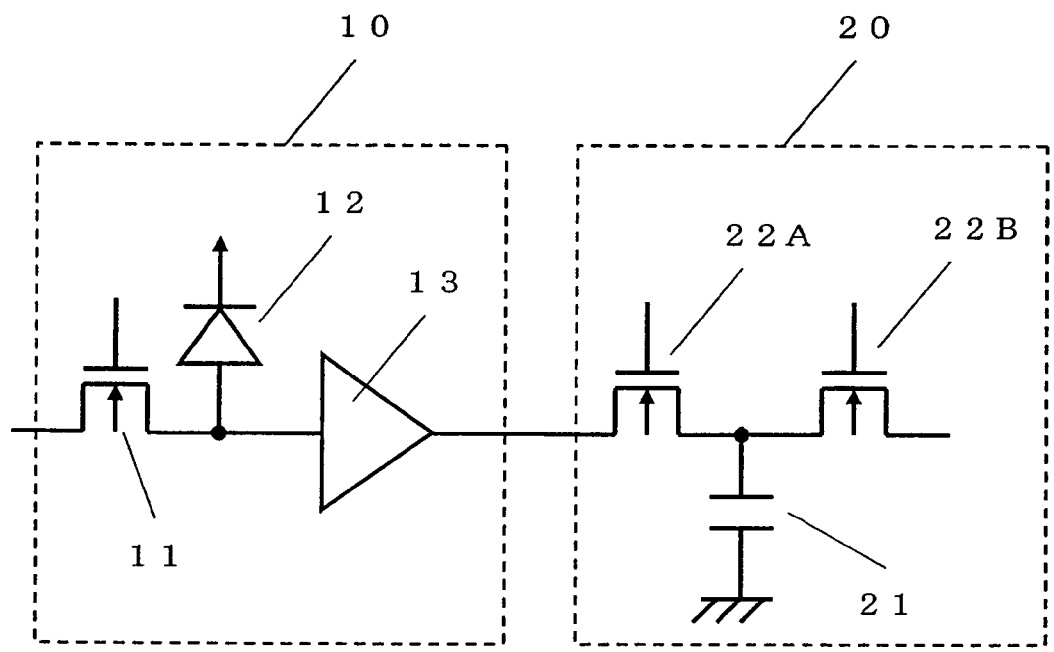
FIG. 3 is an exemplary circuit diagram showing an image sensor of a related art.

FIG. 2 is a schematic top view showing pixel regions of an image sensor according to a second embodiment of the present invention.

The pixel region of the image sensor according to the first embodiment and that of the second embodiment are different from each other in the following point. In place of the shape of the light-transmissive conductive material 201 for potential fixation, which is formed of a polycrystalline silicon thin film or the like covering the pixel regions 101-104, as shown in the example of FIGS. 1A-1B, a light-transmissive conductive material 301 for potential fixation, which is formed of a polycrystalline silicon thin film or the like having a shape with an opening formed therein so as not to block the incident light into pixel regions 101 and 102, is formed in a cross shape in the second embodiment.

As described in the example of FIGS. 1A-1B, the light-transmissive conductive material 301 may be formed of a polycrystalline silicon thin film having a thickness of, for example, 2000 Å or smaller, preferably 1000 Å or smaller, and optimally 500 Å or smaller, or may be formed of an ITO (compound of indium, tin, and oxygen) thin film, thereby making it possible to significantly reduce light absorption by the light-transmissive conductive material. However, it is difficult to make the conductive material completely transparent (transmittance of 100%). As a countermeasure thereof, there is employed a structure for preventing the incident light from being blocked by forming the light-transmissive conductive material 301 for potential fixation in the pixel regions 101 and 102 in an elongated shape so as to provide an opening therein.

The light-transmissive conductive material 301 is preferably formed in such a shape with an opening as large as possible. In addition, as in the first embodiment, it is preferable that the potential of the light-transmissive conductive material 301 be electrically connected so as to be held at the same potential as the substrate potential of the silicon substrate for forming the image sensor. In the second embodiment shown in FIG. 2, there is illustrated the example where the light-transmissive conductive material 301 is formed in elongated linear shapes to be arranged in a cross shape. Alternatively, it is possible to employ a shape obtained by combining elongated shapes so as not to block the incident light. Any shapes other than the shape shown in FIG. 2 may be employed.

For ease of explanation, in the example of FIG. 2, only the pixel regions 101 and 102 are illustrated, but the light-transmissive conductive material 301 for potential fixation, which is formed of a polycrystalline silicon thin film or the like with the same shape, is formed in each of the plurality of pixel regions. The protective film is denoted by reference numeral 302. The other explanations thereof are omitted by denoting the same components as those of FIG. 1 by the same reference numerals.

What is claimed is:

1. A manufacturing method for an image sensor integrated circuit, comprising:
   arranging on a silicon substrate a plurality of pixel regions each having a photodiode;
   forming a light-transmissive conductive film over the silicon substrate; and
   forming a protective film on the light-transmissive conductive film while electrically connecting the light-transmissive conductive film to hold the same potential as that of the silicon substrate.

2. A manufacturing method according to claim 1; wherein the light-transmissive conductive film comprises a polycrystalline silicon thin film.

3. A manufacturing method according to claim 2; wherein a thickness of the polycrystalline silicon thin film is 1,000 Å or smaller.

4. A manufacturing method according to claim 2; wherein a thickness of the polycrystalline silicon thin film is 500 Å or smaller.

5. A manufacturing method according to claim 1; wherein the light-transmissive conductive film comprises an indium tin oxide (ITO) thin film.

6. A manufacturing method according to claim 1; wherein the light-transmissive conductive film is formed so as to be disposed over and completely cover the photodiode of each of the plurality of pixel regions.

7. A manufacturing method according to claim 1; wherein the light-transmissive conductive film is formed with at least one opening that prevents blocking of incident light to the plurality of pixel regions.

8. A manufacturing method according to claim 1; wherein the light-transmissive conductive film is formed so as to be shaped with a plurality of straight lines forming at least one opening that prevents blocking of incident light to the plurality of pixel regions.

9. A manufacturing method for an image sensor integrated circuit, comprising:
   forming a light-transmissive conductive film over a silicon substrate;
   arranging on the silicon substrate plurality of pixel regions so as to underlie the light-transmissive conductive film, each of the plurality of pixel regions having a photodiode; and
   forming a protective film on the light-transmissive conductive film and on the underlying pixel regions while electrically connecting the light-transmissive conductive film to hold the same potential as that of the silicon substrate and while maintaining a potential of each underlying pixel region substantially constant over the entire underlying pixel regions to form the protective film with substantially uniform thickness and quality.

10. A manufacturing method according to claim 9; wherein the light-transmissive conductive film comprises a polycrystalline silicon thin film.

11. A manufacturing method according to claim 10; wherein a thickness of the polycrystalline silicon thin film is 1,000 Å or smaller.

12. A manufacturing method according to claim 10; wherein a thickness of the polycrystalline silicon thin film is 500 Å or smaller.

13. A manufacturing method according to claim 9; wherein the light-transmissive conductive film comprises an indium tin oxide (ITO) thin film.

14. A manufacturing method according to claim 9; wherein the plurality of pixel regions are arranged so that the light-transmissive conductive film completely covers the photodiode of each of the plurality of pixel regions.

15. A manufacturing method according to claim 9; wherein the light-transmissive conductive film is formed with at least one opening that prevents blocking of incident light to the plurality of pixel regions.

16. A manufacturing method according to claim 9; wherein the light-transmissive conductive film is formed so as to be shaped with a plurality of straight lines forming at least one opening that prevents blocking of incident light to the plurality of pixel regions.

17. A manufacturing method for an image sensor integrated circuit, comprising:
   arranging on a silicon substrate a plurality of pixel regions each having a photodiode;
   forming over the silicon substrate a light-transmissive conductive film having a plurality of openings for preventing blocking of incident light to the plurality of pixel regions; and
   forming a protective film on the light-transmissive conductive film while electrically connecting the light-transmissive conductive film to hold the same potential as that of the silicon substrate.

18. A manufacturing method according to claim 17;
   wherein the light-transmissive conductive film has having a transmittance of less than 100%.

19. A manufacturing method according to claim 17; wherein the light-transmissive conductive film comprises a polycrystalline silicon thin film.

20. A manufacturing method according to claim 17; wherein the light-transmissive conductive film comprises an indium tin oxide (ITO) thin film.

* * * * *